(12) United States Patent
Huang et al.

(10) Patent No.: US 7,868,666 B2
(45) Date of Patent: Jan. 11, 2011

(54) LOW-QUIESCENT-CURRENT BUFFER

(75) Inventors: Lei Huang, Beijing (CN); Weiming Sun, Beijing (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/420,608

(22) Filed: Apr. 8, 2009

(65) Prior Publication Data

US 2010/0259298 A1 Oct. 14, 2010

(51) Int. Cl.
*H03K 3/00* (2006.01)
*H03K 19/094* (2006.01)

(52) U.S. Cl. .................. 327/109; 327/322; 327/205; 327/206; 326/83; 326/70; 326/71

(58) Field of Classification Search .............. 326/70, 326/71, 76; 327/77, 205, 206
See application file for complete search history.

(56) References Cited

U.S. PATENT DOCUMENTS

| | | | | |
|---|---|---|---|---|
| 4,475,050 A | * | 10/1984 | Noufer | 326/71 |
| 4,763,022 A | * | 8/1988 | Sheldon | 326/71 |
| 5,087,841 A | | 2/1992 | Rogers | |
| 5,256,916 A | | 10/1993 | Thurston | |
| 5,483,176 A | * | 1/1996 | Rodriguez et al. | 326/21 |
| 5,880,604 A | * | 3/1999 | Kawahara et al. | 326/83 |
| 6,091,265 A | * | 7/2000 | Singh | 326/83 |
| 6,097,216 A | * | 8/2000 | Youn | 326/71 |
| 6,140,835 A | * | 10/2000 | Shirai | 326/24 |
| 6,236,613 B1 | * | 5/2001 | Ooishi | 365/226 |
| 6,323,701 B1 | * | 11/2001 | Gradinariu et al. | 327/109 |
| 6,359,470 B1 | * | 3/2002 | Palusa | 326/70 |

* cited by examiner

*Primary Examiner*—Vibol Tan
(74) *Attorney, Agent, or Firm*—Kevin D. Jablonski; Graybeal Jackson LLP

(57) ABSTRACT

An embodiment of an input-buffer circuit may include an input stage with an inverter having an input operable to receive a signal to be translated. The input stage may include a limiting circuit coupled to the input stage for arresting quiescent current. Additional embodiments of an input-buffer circuit formed according to the subject matter disclosed herein may include feedback transistors suited to provide additional current to the input stage and a hysteresis circuit suited to provide hysteresis current to the input stage when an input signal has a high-frequency change rate.

28 Claims, 4 Drawing Sheets

LOW-QUIESCENT-CURRENT BUFFER

BACKGROUND

An integrated circuit (IC) may be designed to receive and provide logic signals at respective voltage levels that depend on the logic family of the IC or of a circuit coupled to the IC. Examples of logic families include Transistor-to-Transistor Logic (TTL) and Complimentary Metal-Oxide Semiconductor (CMOS) Logic. A TTL logic signal may be defined as having a low logic level (corresponding to a logic 0) when the signal has a voltage level that is less than or equal to 0.8 Volts (for example, a voltage level between 0.0 and 0.8 V), and may be defined as having a high logic level (corresponding to a logic 1) when the signal has a voltage level greater than or equal to 2.2 V (for example, a voltage level between 2.2 V and 3.0 V). In contrast, a CMOS logic signal may be defined as having a low logic level (logic 0) when the signal has a voltage level that is less than VCC/2 (for example, less than 2.5 V when VCC=5.0 V), and may be defined as having a high logic level when the signal has a voltage level greater than VCC/2 (for example, greater than 2.5 V when VCC=5.0 V).

Although an IC may be designed to receive and transmit logic signals according to the specifications of one logic family via its external input/output (I/O) pins, the IC may generate internal logic signals according to the specifications of another family. For example, an IC may be capable of receiving and transmitting TTL logic signals externally, but may generate CMOS logic signals internally. Therefore, such an IC translates a received input TTL logic signal into an internal CMOS logic signal, and translates an internal CMOS logic signal into a transmitted external TTL logic signal. Consequently, each I/O pin on such an IC may be coupled to an I/O buffer that translates TTL logic levels to CMOS logic levels and vice-versa.

A conventional I/O buffer, however, may have various problems. For example, the bandwidth of the buffer may be limited, or the buffer may draw a significant quiescent current (sometimes called leakage current, static high current, or $I_{CCT}$), which may result in significant quiescent power consumption that may reduce battery life in mobile devices.

BRIEF DESCRIPTION OF THE DRAWINGS

Embodiments of the subject matter disclosed herein will become more readily appreciated as the same become better understood by reference to the following detailed description, when taken in conjunction with the accompanying drawings.

DETAILED DESCRIPTION

The following discussion is presented to enable a person skilled in the art to make and use the subject matter disclosed herein. The general principles described herein may be applied to embodiments and applications other than those detailed above without departing from the spirit and scope of the subject matter disclosed herein. This disclosure is not intended to be limited to the embodiments shown, but is to be accorded the widest scope consistent with the principles and features disclosed or suggested herein.

By way of overview, a method and system formed according to the subject matter disclosed herein may provide an input-buffer circuit that translates a logical signal from a first logic level to a second logic level while drawing a lower quiescent current, and with a significantly higher bandwidth, than conventional translating buffers. Embodiments of the subject matter disclosed herein may include quiescent-current-arresting transistors as part of the input stage. Additional embodiments of an input-buffer circuit formed according to the subject matter disclosed herein may include capacitive elements to assist with DC-bypass, feedback transistors suited to provide additional current to the input stage, and a hysteresis circuit suited to provide hysteresis current to the input stage. These and other features are discussed further with respect to FIGS. 1-6 below.

Figure 1:
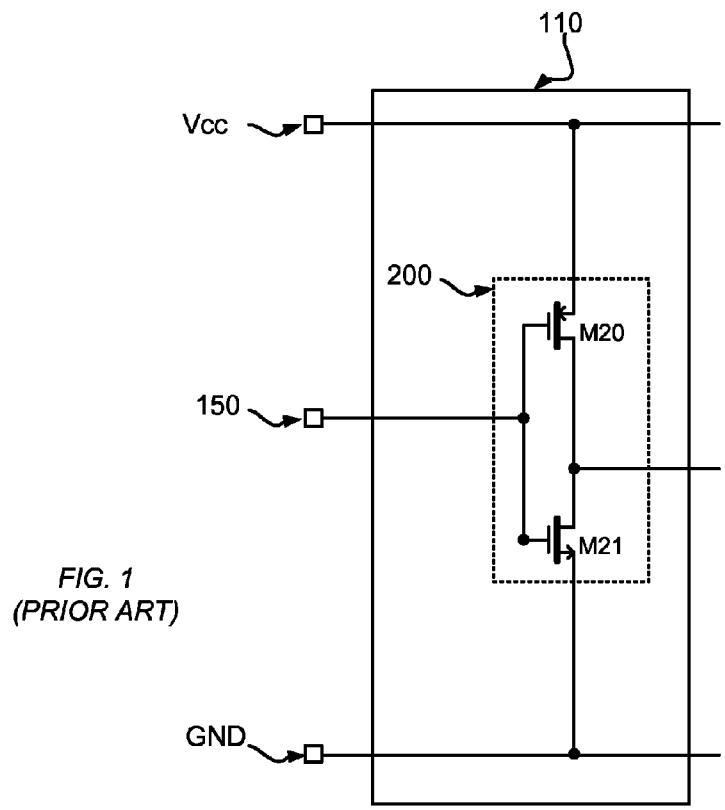
FIG. 1 is a circuit diagram of a conventional input stage.

FIG. 1 is a circuit diagram of a conventional buffer input stage 110. As alluded to above, translating TTL logic levels to CMOS logic levels with the input stage 110 may cause the input stage to draw excessive quiescent current. The input node 150 of the input stage 110 is coupled to a pair of transistors, PMOS transistor M20 and NMOS transistor M21, which together form a first inverter 200. The inverter 200 is coupled between two voltage supply nodes or rails $V_{cc}$ and GND. Because the inverter 200 is coupled directly between the high-voltage rail $V_{CC}$ and the low-voltage rail GND, the inverter may draw a quiescent current that is too high for some applications, e.g., battery-powered applications.

For example, assume for purposes of discussion that $V_{CC}=3.3$ V, the input node 150 receives a TTL signal having a high logic level of 2.2 V, and the threshold voltages of transistors M20 and M21 equal 0.7 V. Therefore, because the gate-to-source voltage of M21 is 2.2V, M21 is on. Furthermore, because the source-to-gate voltage of the transistor M20 is 1.1 V (3.3 V−2.2 V), the transistor M20 is also on. Because both M20 and M21 are "on," a significant quiescent current flows between the high and low supply rails through these transistors.

Likewise, when the input 150 receives a TTL low logic level of 0.8 V, the source-to-gate voltage of the transistor M20 is 2.5 V such that M20 is "on." Furthermore, the gate-to-source voltage of transistor M21 is 0.8 V, so M21 is also on. Again, because both transistors M20 and M21 are "on," a significant quiescent current flows between the high and low supply rails through these transistors.

Because the quiescent current in the above two examples may be significant, it may be too high for some applications, particularly for battery-operated applications, where this quiescent-current drain may significantly shorten the battery life.

But as discussed below, an embodiment of an input-buffer circuit discussed below in conjunction with FIGS. 2-5 may diminish or even eliminate this quiescent current without reducing the bandwidth of the buffer.

Figure 2:
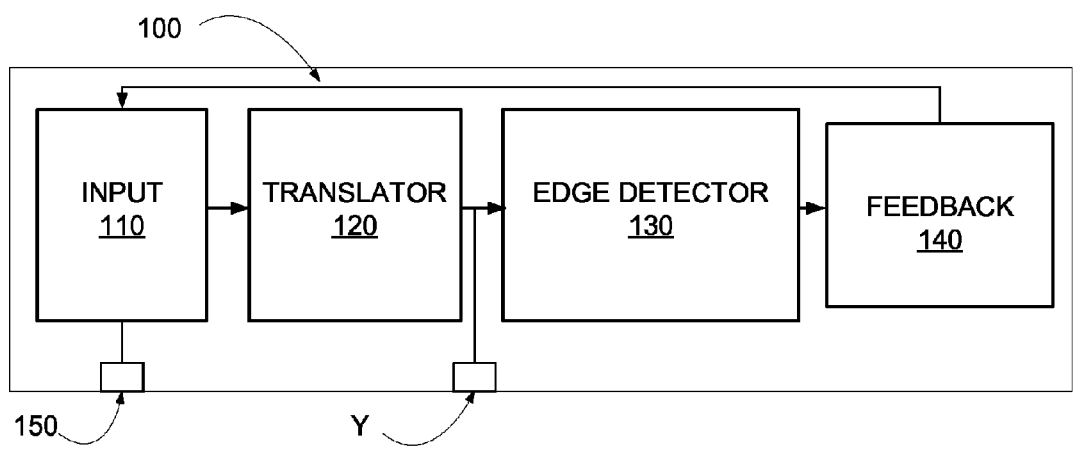
FIG. 2 is a block diagram of an embodiment of an input-buffer circuit.

FIG. 2 is a block diagram of an embodiment of an input-buffer circuit 100 that may be part of an IC having internal logic components that operate with different logic levels than the logic levels of external signals that the IC receives from and transmits to a source located outside of the IC. The input-buffer circuit 100 translates received external signals into logic levels compatible with the internal logic components of the IC. Another circuit (not shown) may translate internal signals into logic levels compatible with the source external to the IC. Together, the input-buffer circuit 100 and this other circuit may form an I/O buffer for an external pin of the IC. Because this other circuit may be conventional, it is not described further.

The input-buffer circuit 100 may include four stages: an input stage 110, a translator stage 120, an edge-detector stage 130, and a feedback stage 140.

The input stage 110 may be coupled to an external input (or I/O) pin 150, and the translator stage 120 may be coupled to an output node Y, which may act as an input node for one or more internal components (not shown in FIG. 1) of the IC on which the input-buffer circuit 100 is disposed, such that these internal components receive signals on the pin 150 via the buffer circuit 100.

As discussed below, the edge-detector stage 130 and the feedback stage 140 may allow the input buffer 100 to have a higher bandwidth that it otherwise would without the edge-detector stage or the feedback stage.

The topology and operation of each of the stages 110, 120, 130, and 140 is discussed below with respect to FIGS. 3-5.

Figure 3:
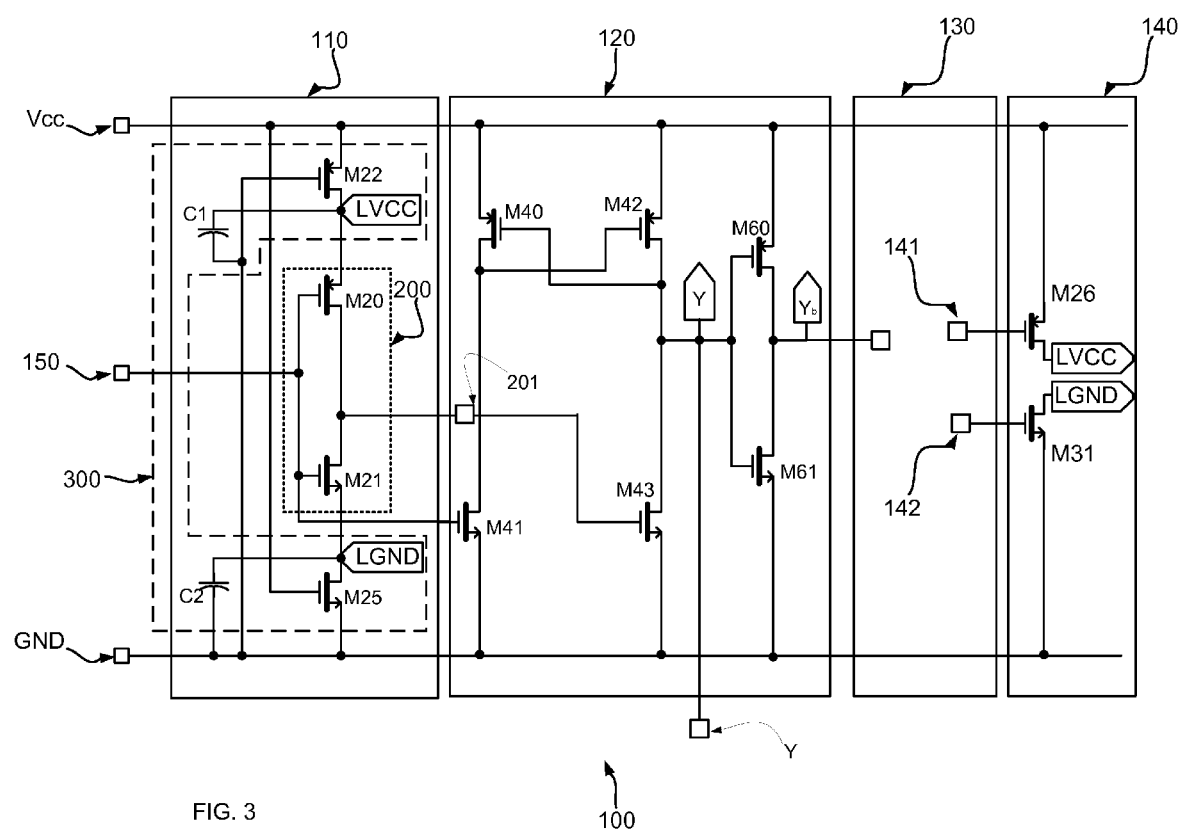
FIG. 3 is a circuit diagram of an embodiment of the input-buffer circuit of FIG. 2.

FIG. 3 is a circuit diagram of an embodiment of the input-buffer circuit 100 of FIG. 2, where like numbers reference components common to FIGS. 2 and 3. Furthermore, the edge-detector stage 130 is shown as a block in FIG. 3, but is described in more detail below in conjunction with FIG. 4.

The input stage 110 includes components for reducing or eliminating quiescent current flowing through the inverter 200. Two additional transistors (PMOS transistor M22 and NMOS transistor M25) as well as two capacitors (C1 and C2) form a limiter circuit 300 that is coupled in series with the inverter 200; transistor M22 is coupled between the high-voltage rail $V_{CC}$ and the transistor M20, and the transistor M25 is coupled between the transistor M21 and the low-voltage rail GND. Transistors M22 and M25 may be relatively small transistors (i.e., may have relatively small width-to-length ratios) with respect to the transistors M20 and M21 of the inverter 200, and thus may have relatively high resistances even when "on." Therefore, because the transistors M22 and M25 are in the quiescent current path of the input stage 110, they may reduce the amount of quiescent current drawn by the input stage as compared to the amount of quiescent current drawn by the input stage 110 of FIG. 2. Typical width-to-length ratios for these transistors may be 0.7 u/10 u for M22, 1 u/4 u for M25, 16 u/0.35 u for M20, and 5 u/0.35 u for M21.

In an effort to assist with pulling the node 201 up or down to a fully or nearly full CMOS logic level, the two capacitors C1 and C2 may respectively hold an internal node Local VCC (LVCC) to or near to VCC, and an internal node Local Ground (LGND) to or near to GND.

Assume for purposes of discussion that Vcc=5 V, GND=0 V, the signals received by the input node 150 are TTL signals, and the threshold voltages of M20 and M21 are 0.7 V.

In operation, when the signal on the input node 150 is at a high logic level (for example 2.2 V), the transistors M21 and M25 are on (M25 is always on because its gate is coupled directly to the high-voltage rail $V_{CC}$), which pulls the output 201 of the inverter 200 to a low logic level. Although the transistor M20 may also be on, the relatively high resistance of the transistor M22 (which is always on because its gate is coupled directly to the low-voltage rail GND) limits the current that flows through the transistor M20, and thus limits the quiescent current that flows through the inverter 200.

Similarly, when the signal on the input node 150 is at a low logic level (for example 0.0 V), the transistor M20 may be on as well as the transistor M22, and together these transistors pull the node 201 to a high logic level. Although the transistor M21 may also be on, the relatively high resistance of the transistor M25 limits the current that flows through the transistor M21, and thus limits the quiescent current that flows through the inverter 200.

Furthermore, during times when M20 is off, or at least is off to a higher degree than the transistor M21 (i.e., when there is a logic high voltage on the input node 150), the capacitor C1 charges to Vcc or to near Vcc via the transistor M22. However, the capacitor C2 charges up from GND due to the switching current through M21 being greater than the current through M25. But after the parasitic capacitance associated with the node 201 is discharged, the capacitor C2 discharges back toward GND via the transistor M25.

Similarly, during times when M21 is off, or at least is off to a higher degree than the transistor M20 (i.e., when there is a logic low voltage on the input node 150), the capacitor C2 charges to GND or to near GND via the transistor M25. However, the capacitor C1 charges down from Vcc due to the switching current through M20 being greater than the current through M22. But after the parasitic capacitance associated with the node 201 is charged, the capacitor C1 charges back toward Vcc via the transistor M22.

As the transitioning frequency of the logical signal on the input node 150 becomes higher, however, the capacitive elements C1 and C2, respectively, may have insufficient time to charge back to Vcc and to discharge back to GND, thus causing the voltage at LGND to be significantly higher than 0 V and the voltage at LVCC to be significantly lower than Vcc. Therefore, this may cause the logic levels on the node 201 to be significantly different than CMOS logic levels. Because, transistors M22 and M25 are relatively high-resistance transistors by design to reduce the quiescent current draw, the time constant at which the capacitive elements C1 and C2 are recharged is relatively long. Therefore, at relatively high-transition frequencies at the input node 150, the capacitive elements C1 and C2 are respectively discharged and charged faster than they can be recharged and re-discharged.

The edge-detector stage 130, which is further described below with respect to FIG. 4, and the feedback stage 140 may remedy this problem by recharging C1 and discharging C2 faster than the transistors M22 and M25 alone can do this.

The feedback stage 140 (which in an embodiment may also be considered part of the input stage 110) may include two transistors; M26 assists M22 with recharging C1, and thus with recharging the node LVCC, to Vcc or to near Vcc, and M31 assists M25 with discharging C2, and thus with discharging the node LGND, to GND or to near GND. The transistors M26 and M31 are relatively large and, thus, have a relatively low resistance. Therefore, when transistors M26 and M31 turn on, they can quickly provide compensation current to recharge the capacitor C1 and discharge the capacitor C2 to or near $V_{CC}$ and to or near GND, respectively. Therefore, instead of having to wait for the relatively slow charging time constant associated with transistors M22 and M25, (because the transistors are small and have a high resistance) the feedback transistors M26 and M31 (when activated by signals from the edge-detector 130 as described below) quickly recharge/discharge capacitive elements C1 and C2 in response to a signal transition at the input node 150.

Still referring to FIG. 3, in operation according to an embodiment, when the signal at the input node 150 transitions from logic low to logic high, the signal on the node 201 transitions from a logic high to a logic low, as does the signal on the node Yb, which is the input node of the edge-detector stage 130. In response to the high-to-low signal transition on the node Yb, the stage 130 activates the transistor M31 for a predetermined time. Due to its relatively low on resistance, the transistor M31 discharges C2 and pulls the node LGND to or to near GND for as long as M31 is on. If another low-to-high transition occurs on the node 150 before the stage 130 turns M31 off, then M31 stays on. This feature may allow the input stage 110 to operate properly even in response to high-frequency signals at the input node 150, and thus may increase the bandwidth of the buffer 100 as compared to the bandwidth of the buffer without the stages 130 and 140.

Likewise, when the signal at the input node 150 transitions from logic high to logic low, the signal on the node 201 transitions from a logic low to a logic high, as does the signal on the node Yb. In response to the low-to-high signal transition on the node Yb, the stage 130 activates the transistor M26 for a predetermined time. Due to its relatively low on resistance, the transistor M26 charges C1 and pulls the node LVCC up to or to near Vcc for as long as M26 is on. If another high-to-low transition occurs on the input node 150 before the stage 130 turns M26 off, then M26 stays on.

As stated above, if the frequency of the signal at the input 150 is above a particular threshold frequency, then the edge-detector stage 130 may cause the feedback transistors M26 and M31 to remain on constantly while the signal frequency is above the threshold frequency. That is, each feedback transistor M26 and M31 is reactivated before it's deactivated so, in essence, these transistors M26 and M31 are turned on faster than they can be turned off. When transistors M26 and M31 are constantly on, the node LVCC is held to or near to $V_{CC}$ and the node LGND is held to or near to GND. But when the frequency of the signal at the input node 150 decreases below the threshold frequency, then these transistors M26 and M31 are not constantly on, and the transistors M22 and M25 take over to limit the quiescent current flow through the input stage 110 (when the frequency of the signal at the input node 150 is above the threshold frequency, then the quiescent current is less of an issue).

In an alternative embodiment, the edge-detection stage 130 may turn on both of the transistors M26 and M31 in response to a signal transition (either low to high or high to low) on the input node 150.

Still referring to FIG. 3, the translator stage 120 may include a pair of NMOS transistors M41 and M43 for respectively receiving the signal at the input node 150 and the signal at the node 201 at their respective gates. That is, the input node 150 is coupled to the gate of transistor M41, and the node 201 is coupled to the gate of the transistor M43. A pair of cross-coupled PMOS transistors M40 and M42 have their gates coupled to the drains of M43 and M41, respectively. The threshold voltages of M40-M43 are set in a conventional manner so that the stages 110 and 120 operate together as described below.

Together, the stages 110 and 120 translate a TTL signal on the input node 150 into a CMOS logic signal on the nodes Y and Yb (the signal at the node Yb is the complement of the signal at the node Y). For example, when a high logic level TTL signal is applied to the input node 150, the transistor M41 turns on and also turns on the transistor M42, which tends to pull the node Y up to Vcc and to turn off M40. Furthermore, the logic low signal at the node 201 turns off M43, thus reinforcing the logic high level Vcc on the node Y and the turning off of M40. In such a state, little or no quiescent current flows through the stage 120. Similarly, when a low logic level TTL signal is applied to the input node 150, the transistor M41 turns off. Furthermore, the logic high signal at the node 201 turns on M43, which pulls the node Y to or near to GND and which thus turns on M40. Because M41 is off, the transistor M40 turns off M42, thus reinforcing the logic low level on the node Y In such a state, little or no quiescent current flows through the stage 120.

The output node Y, which may carry a CMOS logic signal, may be coupled to any circuit or circuits that need to receive the original signal at the input node 150, but at a CMOS logic level instead of a TTL logic level. For example, if the buffer 100 is a stand-alone IC, then it may act as a logic-level translator for circuits such as a processor or a memory. Alternatively, the buffer 100 may be part of a larger IC, and may act as a logic-level translator for other circuits on the IC. In addition, the translator stage 120 may include one or more inverters (only one inverter including transistors M60 and M61 shown in FIG. 3) for buffering the output node Y of the translator stage so that the edge-detection circuit 130 does not load down the output node Y.

Figure 4:
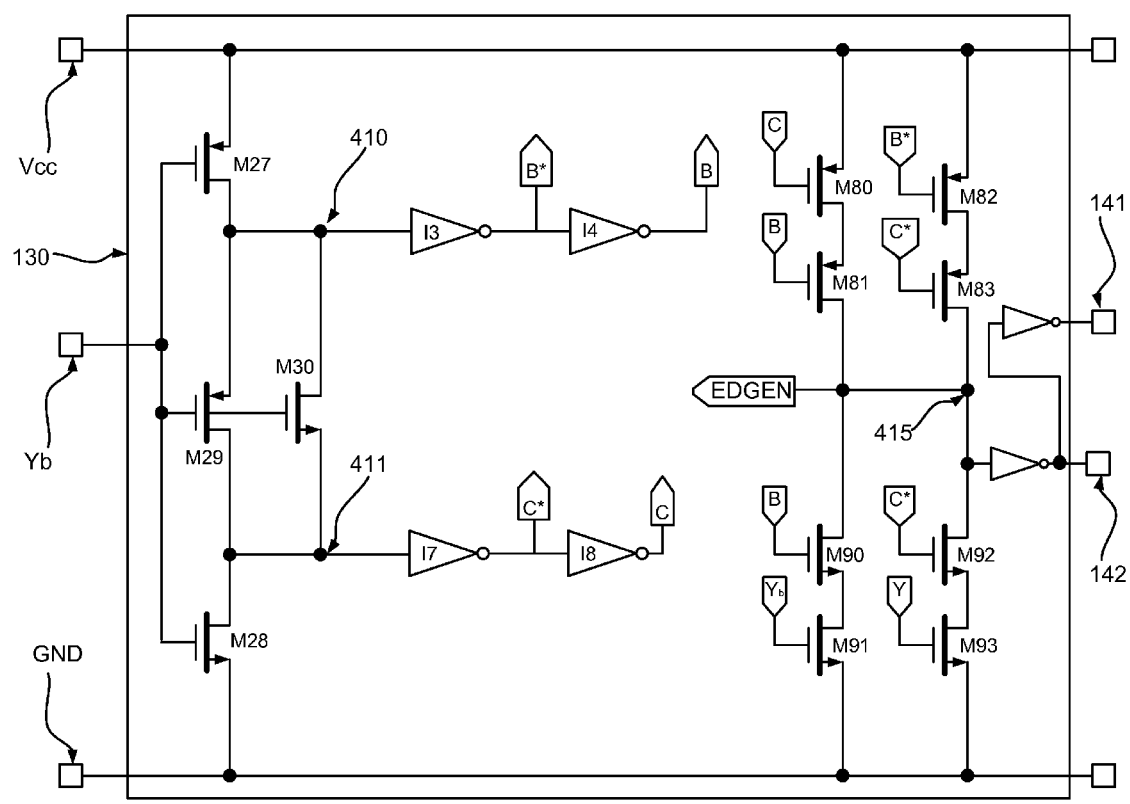
FIG. 4 is a circuit diagram of an embodiment of the edge-detector of FIGS. 2 and 3.

FIG. 4 is a circuit diagram of an embodiment of the edge-detection circuit 130 of FIGS. 2 and 3, in which the edge-detection circuit activates both transistors M26 and M31 of the feedback stage 140 (FIG. 3) in response to any transition on the input node 150 (FIG. 3). The edge-detection circuit 130 operates as a "one shot" circuit such that in response to any detected edge at the node Yb, (which is related to an edge of the input signal 150 of FIGS. 2 and 3), provides drive signals at nodes 141 and 142 for the feedback stage 140 (for example, the nodes 141 and 142 may be coupled to the gates of the transistors M26 and M31, respectively, of the feedback stage 140 of FIG. 3). Thus, as a signal Yb is received at a first circuit formed by (transistors M27, M28, M29, and M30), two signals begin to propagate through two paths. A first path may include inverters I3 and I4 such that two signals B and B* may be realized. Similarly, a second path may include inverters I7 and I8 such that two signals C and C* may be realized.

In operation during a steady state, (i.e., when the signal at input node 150 is not transitioning), assume for the purposes of this example that the signal at node Yb has a high logic level. Transistors M27 and M29 are off and transistors M28 and M30 are on, thereby pulling nodes 410 and 411 to GND (a low logic level). Furthermore, the signals B* and C* are at high logic levels, and the signals B and C are at low logic levels.

These signals may then used to generate the drive signals 141 and 142 from PMOS transistors M80, M81, M82, and M83 and NMOS transistors M90, M91, M92 and M93 respectively. Again assuming a steady-state scenario when node Yb is at a high logic level, transistors M80, M81 M91 and M92 are all on while transistors M82, M83, M90, and M93 are all off. Thus, the only serially coupled transistors that are both on (thereby providing a current path) are M80 and M81, that pull the node 415 up to Vcc. With node 415 at a high logic level, drive signal 142 is a low logic level because of inverter I2 and drive signal 141 is a high logic level because of inverter I1. A low logic level for drive signal 142 keeps feedback transistor M31 (FIG. 3) off. Similarly a high logic level for drive signal 141 also keeps feedback transistor M26 off. Therefore, as discussed above in conjunction with FIG. 3, in the steady-state, the feedback transistors M26 and M31 in the feedback stage 140 do not provide feedback current for respectively charging and discharging the capacitors C1 and C2.

Similarly in the steady-state scenario when a signal at the node Yb is a low logic level, a reciprocal set of transistor states and logical states also results in feedback transistors remaining off, wherein transistor M82 and M83 are on providing a current path to pull node 415 up to Vcc, and M91-M92 being off.

Still referring to FIG. 4, as the signals at nodes Y (FIG. 3) and Yb transition, (for example, purposes, assume that the signal Yb transitions from a logic high signal to a logic low signal), the signal transitions also begin to propagate through the various transistors and inverters of the edge-detection stage 130. The first transistor to transition is either M91 or M93, because their gates are coupled to Yb and Y, respectively. So, in the above example when the signal at node Yb transitions from logic high to logic low, M91 turns off, thus matching M90, which is also off at this time because the signal B is still at a low logic level, and transistor M93 turns on, thus matching transistor M92, which is also on because C* is still at a high logic level. Therefore, the transistors M92 and M93, which are both on at this time, pull down the node 415 to GND and thereby turn on the feedback transistors M26 and M31 via the drive signals on the nodes 141 and 142. Although the transistors M80 and M81 are still on, these transistors are smaller than M92 and M93, such that the node 415 is pulled to ground. Although a quiescent current flows through transistors M80, M81, M92, and M93, this current flows only for a time that is approximately equal to the shorter of the delays through the inverters I3 and I7.

As the signal transition on the node Yb propagates to the inverters I3 and I7, the signals B* and C* also transition from high to low logic levels after a delay associated with these inverters. Therefore, transistors M82, and M83 turn on, and transistor M92 turns off. If no other transitions of the input signal Yb are forthcoming, then the transistors M82 and M83 pull the node 415 back up to Vcc, thus causing the feedback transistors M26 and M31 (FIG. 3) to turn off. However, if Yb transitions from a logic low to a logic high level before the "first" transition from logic high to logic low has propagated through the inverters I4 and I8, then transistors M91 and M93 transition again such that both M90 and M91 are on, and thus pull down the node 415 to GND, thus keeping feedback transistors M26 and M31 on. On a following transition of Yb from logic high to logic low, the transistors M92 and M93 again turn on and pull the node 415 to GND as discussed above. Thus, as long as the signal on the node Yb is transitioning at a period faster than the combined delay time through the transistors M27-M30, I3 and I7, and I4 and I8, then the drive signals 141 and 142 will be low and high, respectively, and will thus maintain the feedback transistors M26 and M31 in an on state because there will always be a GND current paths through either M90 and M91 or through M92 and M93. When the signal at node Yb stops transitioning, then no quiescent current flows through the edge-detection stage 130 between Vcc and GND.

Based upon the combination of gate node signals on the transistors in the edge-detector stage 130, the drive signals 141 and 142 may be generated for a short duration of time when the signal Yb transitions from a low logic level to a high logic level. These drive signals momentarily (i.e., a one-shot) turns on both feedback transistors M26 and M31 (as shown in FIG. 3) to provide a current boost to the LVCC node and the LGND node. In other embodiments (such as, for example, one of the embodiment described above when the edge-detector stage 130 was discussed with respect to FIG. 3), the stage 130 may be modified to turn on only the feedback transistor M26 (FIG. 3) in response to a high-to-low transition of the signal on the node 150, and to turn on only the feedback transistor M31 (FIG. 3) in response to a low-to-high transition of the signal on the node 150.

Referring to FIGS. 2-4, alternate embodiments of the input buffer are contemplated. For example, the input stage 110 may include only one of the transistors M22 and M25, the capacitor C1 or C2 coupled to the only one transistor, and the feedback circuit may include only the transistors M26 or M31 coupled to the only one transistor. For example, the input stage 110 may include only the transistor M22 and capacitor C1, and the feedback stage 140 may include only M26.

Figure 5:
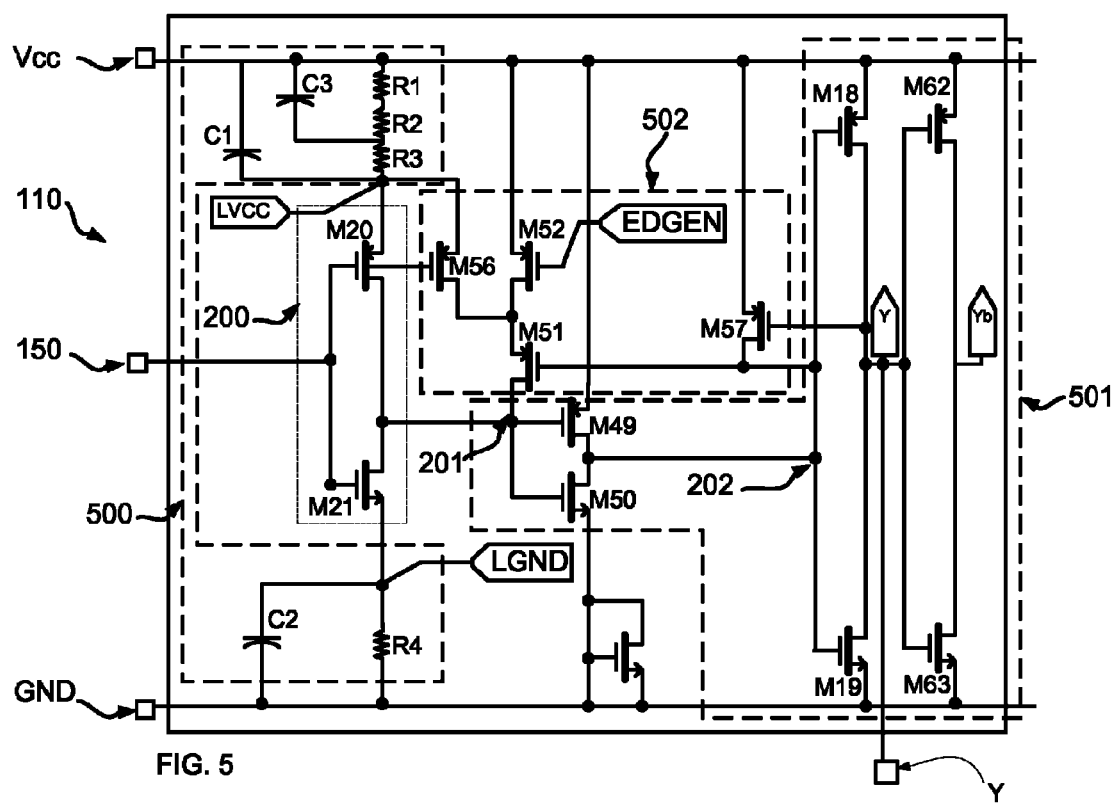
FIG. 5 is a circuit diagram of another embodiment of the input stage of FIG. 2.

FIG. 5 is a circuit diagram of an alternate embodiment of an input stage 110 of FIG. 2, where like numbers reference components common to FIGS. 2 and 3. In this embodiment, a limiter circuit 500 is also coupled in series with an inverter 200 in an input stage 110. As is discussed further below, the input stage 110 in this embodiment includes a voltage translation circuit 501 for changing the voltage of a signal from one logic level to another (e.g., from TTL level to CMOS logic level). Such a translation circuit 501 accomplishes functions previously accomplished by the translator stage 120 of FIGS. 2 and 3, thus eliminating any need for a separate translator stage to be part of the overall input-buffer circuit 100 of FIG. 2. Further, this embodiment includes a hysteresis circuit 502 for providing hysteresis current to the input stage 110 to assist with logic level transitions. These circuits of this embodiment of the input stage 110 are further described in the following paragraphs.

The input stage 110 of FIG. 5 includes components for reducing or eliminating quiescent current flowing through the inverter 200. In the embodiment of FIG. 3, two additional transistors (PMOS transistor M22 and NMOS transistor M25 of FIG. 3) are part of a limiter circuit 300 that is coupled in series with the inverter 200. In this embodiment, these limiting components comprise resistors and capacitors, although the resistors and capacitors may be formed from transistors in a conventional manner. Resistors R1, R2, R3 are in series with each other and are coupled between the high-voltage rail $V_{CC}$ and the node LVCC Further, a capacitor C1 is coupled in parallel with the series combination of R1, R2, and R3, and a capacitor C3 is coupled in parallel with the series combination of resistors R1 and R2. And a resistor R4 is coupled between the node LGND and the low-voltage rail GND, and a capacitor C2 is coupled in parallel with R4.

Together, these components form a limiting circuit 500, which has a relatively high-resistance in the steady state to reduce the amount of quiescent current drawn by the input stage 110 as compared to the amount of quiescent current drawn by the input stage 110 of FIG. 1. As the general operation of this limiting circuit 500 is similar to the operation of the limiting circuit 300 of FIG. 3, it will not be discussed in further detail.

Still referring to FIG. 5, the voltage-translation circuit 501 includes three additional serially coupled inverters configured to change the voltage level of the input signal to a desired level suitable for a different logic family. The translation circuit 501 includes two inverters coupled between the input inverter 200 (comprising transistors M20 and M21) and an output node Y. One of these inverters comprises transistors M49 and M50 and the other inverter comprises transistors M18 and M19. The inverter comprising transistors M49 and M50 may act as the level shifter because the output of the first inverter 200 should have high enough and low enough signal levels so that this second inverter (M49 and M50) is either on or off such that it draws little or no quiescent current. As a result, after passing through the inverter comprising the transistors M49 and M50, an input signal at input node 150 that is at a first logic level (e.g., a TTL level) is translated to a second logic level (e.g., a CMOS logic level).

The subsequent inverter (transistors M18 and M19) may be used to buffer, add a desired propagation delay, or to translate the logical value of output node Y to be an inversion of the input node 150 (since there are three inverters between input node 150 and output node Y). Then, a fourth inverter (comprising transistors M62 and M63) provides a signal Yb that is buffered from the output node Y to the edge-detector 130 such that the edge-detector 130 does not load down the signal at the output node Y.

Still referring to FIG. 5, the embodiment as shown includes a hysteresis circuit 502 that addresses an additional problem that may be present when an input signal transitions from low to high or from high to low relatively slowly (i.e., the slope with respect to time of the signal is not steep enough). Such a slow transition may cause the input stage 110 to oscillate, particularly if the signal at the input node 150 lingers too close to a "trip point" (i.e., the voltage level wherein the inverter 200 transitions the signal level at its output node.

By way of example, (and assuming the hysteresis circuit 502 is not part of the input stage 110 for the moment) such a trip point may be, for example, 1.5 V where in response to a signal transition at the input node 150, the inverter 200 transitions the signal level at the node 201 in a direction opposite to the direction of the transition at the node 150.

Consider a scenario when the signal at the input node 150 is transitioning from a high signal level to a low signal level, and the voltage at the input node 150 remains slightly below 1.5 V for a significant period of time. At first, the transistor M20 becomes slightly more conductive than the transistor M21. This will cause the voltage at the node 201 to begin to rise. This rising at the node 201 may eventually propagate as a signal transition to the edge-detector and feedback stages 130 and 140 as discussed below.

Because of the resistors R1, R2, and R3 that connect the transistor M20 to the high-voltage rail $V_{CC}$, at some point, the node LVCC will tend to decrease until the source-to-gate voltage of the transistor M20 becomes so low that the transistor M20 becomes less conductive. As a result, the transistor M21 may be more conductive than the transistor M20 such that voltage at the node 201 falls back toward GND. This falling at the node 201 may eventually propagate as a signal transition to the edge-detector and feedback stages 130 and 140 as discussed below.

At some time after the signal level at the node 201 falls, the feedback stage 140 (FIGS. 2 and 3), in response to the previous rising signal level at the node 201, pulls the node LVCC to Vcc. This increases the source-to-gate voltage of the transistor M20, thus rendering M20 more conductive than M21. Therefore, the transistor M20 pulls the node 201 back up toward Vcc. But at some point, the feedback stage 140 is deactivated. If the signal level at the input node 150 is still slightly below 1.5 V, then the transistor M20 may become more conductive than M21 such that signal level on the node 201 falls.

Consequently, as long as the signal level at the input node 150 remains slightly below 1.5 V, the above cycle repeats and causes the input stage 110 to oscillate.

A similar analysis shows that the input stage 110 oscillates for as long as the signal level at the input node 150 remains slightly above 1.5 V.

Therefore, there is a range about the trip point of the inverter 200 such that if the signal at the input node 150 is within this range, the input stage 110 may oscillate.

To prevent such oscillation from occurring, transistors M56, M52, M51 and M57 form a hysteresis circuit 502 that may be used to provide stability the transitions at the node 201. With these transistors placed in the configuration shown in FIG. 5, oscillation effects may be compensated for or prevented altogether.

By way of example, when the signal at the input node 150 transitions from a high signal level to a low signal level, and, therefore, causes the signal at node 201 to begin to transition to high, the transistor M50 begins conducting and pulling the output of the second inverter (node 202) low (i.e., the second inverter comprising transistors M49 and M50). When node 202 is pulled low, transistor M51 begins conducting and provides a hysteresis current path through the transistor M56 (which is on because the signal at input node 150 is transitioning to low) that assists the transistor M20 in pulling the node 201 up to the voltage at the node LVCC. Thus, this first set of transistors M51 and M56 provides hysteresis when the input signal begins transitioning from high to low past the trip point.

Furthermore, additional hysteresis current may be provided via an optional transistor M52. The gate of transistor M52 may be coupled to the signal EDGEN, which is generated in the edge-detection circuit 130 at the node 415 (FIG. 4) as a result of detecting a negative edge of the signal at the output node Y as discussed above in conjunction with FIG. 4. Thus, after a propagation delay in the edge-detection stage 130 resulting from detecting a falling edge as described above, the transistor M52 may be turned on to couple the high-voltage rail $V_{CC}$ to transistor M51 so that transistor M51 may source additional hysteresis current to further assist with pulling the node 201 up to $V_{CC}$. Therefore, even if the input signal 150 is transitioning to a low level at a relatively slow rate, the hysteresis provided by the circuit 502 may prevent the input stage 110 from oscillating.

Still referring to FIG. 5, the transistor M57 may hold the gate of transistor M51 up to the high-voltage rail $V_{CC}$ when the signal at the input node 150 is transitioning from low-to-high, so as to deactivate the transistor M51. The transistor M57 may conduct when the signal at its gate is low (which may correspond to the signal at the input node 150 transitioning high because of three stages of inverters as shown in FIG. 5). When the gate node of the transistor M51 is at a high logic level, the transistor M51 cannot conduct and, thus, the node 201 does not receive any current compensation via hysteresis as described above and is allowed to fall to a low logic level as needed.

Additional sets of transistors in a second hysteresis circuit may be provided (although not shown in FIG. 5) to provide similar hysteresis current to node LGND. Thus, a similar, yet reciprocal, scenario of transistor switching and current compensation to the node LGND may provided in an effort to prevent oscillations at the output node Y when the signal at the input node 150 is slowly transitioning from low to high. Such a reciprocal hysteresis circuit is not discussed in further detail for brevity.

Figure 6:
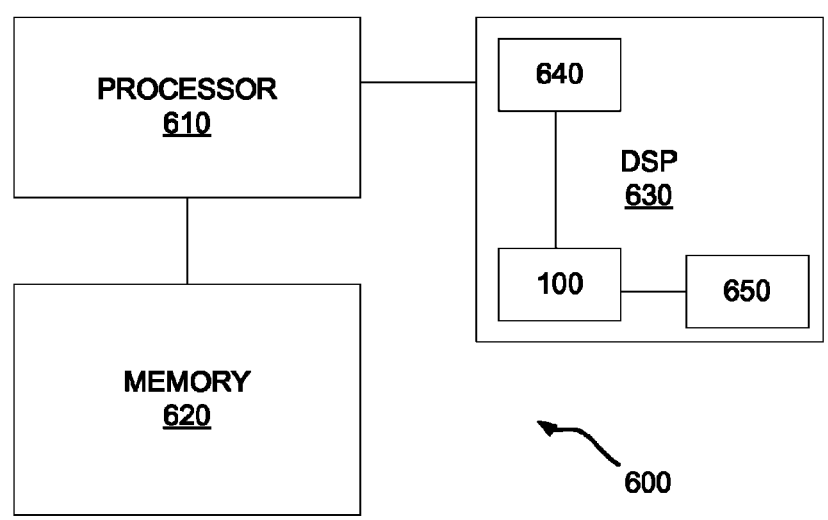
FIG. 6 is a block diagram of a system that may include the input-buffer circuit of FIG. 2.

FIG. 6 is a block diagram of a system 600 that may include the input-buffer circuit 100 of FIG. 2. The system 600 may include a digital signal processing (DSP) component 630 having an input-buffer circuit 100 disposed thereon as well as additional electronic components, such as, for example, a processing unit 640 and a memory unit 650. The input-buffer circuit 100 may be used to translate logic signals to and from one component (e.g., the processing unit 640) suited to operate at a first logic level family (i.e., a TTL level family) to be used by another component (e.g., the memory unit 650) suited to operate at a second logic level family (i.e., a CMOS logic level family). The components of the DSP block 630 may be disposed on a single integrated circuit die or may be disposed on several distinct integrated circuit dies that may be part of a single DSP component 630 package.

Further, the DSP component 630 may also be coupled to additional components as part of the system 600 such as a separate processor 610 and a separate memory 620. Signals sent to and received from these off-chip components may also be translated via the input-buffer circuit 100.

While the subject matter discussed herein is susceptible to various modifications and alternative constructions, certain illustrated embodiments thereof are shown in the drawings and have been described above in detail. Furthermore, those skilled in the art will understand that various aspects described in less than all of the embodiments may, nevertheless, be present in any embodiment. It should be understood, however, that there is no intention to limit the subject matter to the specific forms disclosed, but on the contrary, the intention is to cover all modifications, alternative constructions, and equivalents falling within the spirit and scope of the subject matter disclosed.

What is claimed is:

1. An input stage, comprising:
   first and second supply nodes;
   an input circuit having an input node coupled between the first and second supply nodes; and
   a limiter circuit coupled between at least one of the supply nodes and the input circuit and operable to limit a magnitude of quiescent current flowing through the input circuit between the first and second supply nodes when the input circuit is active, wherein the limiter circuit comprises:
   a transistor coupled between the one of the supply nodes and the input circuit; and
   a capacitive element coupled to the one of the supply nodes.

2. The input stage of claim 1, wherein the input circuit comprises an inverter having a first transistor of a first configuration and a second transistor of a second configuration.

3. The input stage of claim 1 wherein the input circuit comprises a transistor pair, each transistor in the pair having a first size and the transistor coupled between the one of the supply nodes and the inverter comprises a transistor that is larger than the first size.

4. The input stage of claim 1, further comprising a feedback stage coupled to the input circuit and operable to provide current to the input circuit at a predetermined duration of time after a signal at the input node transitions from one logic level to another logic level.

5. The input stage of claim 4 wherein the feedback stage continues to provide current to the input circuit as long as the input signal at the input node transitions between two logic levels at a threshold frequency.

6. The input stage of claim 1 further comprising a translator stage operable to translate the signal at the input from a TTL level signal to a CMOS logic level signal.

7. An input stage, comprising:
   first and second supply nodes;
   an input circuit having an input node coupled between the first and second supply nodes;
   a limiter circuit coupled between at least one of the supply nodes and the input circuit and operable to limit a magnitude of quiescent current flowing through the input circuit between the first and second supply nodes; and
   a hysteresis circuit comprising transistors coupled to the input circuit and operable to provide a hysteresis current to the input circuit in response to a signal at the input transitioning from a first logic level to a second logic level.

8. The input stage of claim 7 further comprising an edge-detector stage operable to detect an edge of the input signal at the input node and operable to trigger the hysteresis circuit to provide current to the input circuit.

9. The input stage of claim 7 wherein the hysteresis circuit provides a hysteresis current for a first predetermined duration of time.

10. The input stage of claim 7, further comprising an additional transistor in the hysteresis circuit and operable to provide hysteresis current to the input circuit after a second predetermined duration of time.

11. The integrated circuit of claim 7, further comprising an edge-detector stage operable to detect an edge of the input signal at the input node and operable to trigger the hysteresis circuit to provide current to the input circuit.

12. A circuit, comprising:
    first and second supply nodes;
    an input node coupled to a first inverter having transistors;
    a first inverter transistor having a gate node coupled to the input node and having first and second source/drain nodes wherein the first source/drain node is coupled to a first internal node;
    a second inverter transistor having a gate node coupled to the input node and a having first and second source/drain nodes wherein the first source/drain node is coupled to a second internal node and the second source/drain node is coupled to the second source/drain node of the first inverter transistor;
    a first limiting transistor having a gate node coupled to the first supply node, a first drain/source node coupled to the second supply node and a second source/drain node coupled to the second internal node;
    a second limiting transistor having a gate node coupled to the second supply node, a first drain/source node coupled to the first supply node and a second source/drain node coupled to the first internal node; and
    a first capacitive element having a first node coupled to the second internal node and a second node coupled to the second supply node.

13. The circuit of claim 12, further comprising:
    a second capacitive element having a first node coupled to the first internal node and a second node coupled to the first supply node.

14. The circuit of claim 12, further comprising:
    a second capacitive element having a first node coupled to the first internal node and a second node coupled to the second supply node.

15. The circuit of claim 12, further comprising:
    a first feedback transistor having a first source/drain node coupled to the first supply node and a second source/drain node coupled to the first internal node; and
    a second feedback transistor having a first source/drain node coupled to the second supply node and a second source/drain node coupled to the second internal node.

16. The circuit of claim 12, further comprising:
    a first hysteresis transistor having a gate node coupled to the gate node of the first inverting transistor, a first source/drain node coupled to the first internal node, and a second source/drain node;
    a second hysteresis transistor having a gate node coupled to an output of a second inverter that is coupled to an output of the first inverter, a first drain/source node coupled to the output of the first inverter, and a second drain/source node coupled to the second drain/source node of the first hysteresis transistor;
    a third hysteresis transistor having a gate node coupled to an edge-detection circuit operable to detect an edge of a signal at the input, a first drain/source node coupled to the output of the first supply node, and a second drain/source node coupled to the first drain/source node of the second hysteresis transistor; and
    a fourth hysteresis transistor having a gate node coupled to an output of a third inverter that is coupled to an output of the second inverter, a first drain/source node coupled to the output of the high-voltage rail, and a second drain/source node coupled to the gate node of the second hysteresis transistor.

17. An integrated circuit, comprising:
an input node;
a buffer input stage coupled to the input node; including:
   first and second supply nodes;
   an inverter coupled between the first and second supply nodes; and
   a limiter circuit coupled between one of the supply nodes and the inverter and operable to limit a magnitude of quiescent current flowing through the inverter between the first and second supply nodes;
an edge-detector stage operable to detect an edge of a signal at the input node; and
a feedback transistor stage operable to provide current to the input stage when an edge is detected.

18. The integrated circuit of claim 17 wherein the input-buffer circuit further comprises a translator stage further operable to translate the signal from a TTL level signal to a CMOS logic level signal.

19. The integrated circuit of claim 17 further comprising an electronic component coupled to the buffer input stage and operable to function using signals having logic levels different than the logic levels of signals at the input node.

20. The integrated circuit of claim 17 comprising a single integrated circuit die.

21. A system, comprising:
a first integrated circuit, including:
   an input node;
   an input stage coupled to the input node; including:
      first and second supply nodes;
      an inverter coupled between the first and second supply nodes;
      a limiter circuit coupled between one of the supply nodes and the inverter and operable to limit a magnitude of quiescent current flowing through the inverter between the first and second supply nodes, wherein the limiter circuit comprises:
         a transistor coupled between the one of the supply nodes and the input circuit; and
         a capacitive element coupled to the one of the supply nodes; and
   a translator stage further operable to translate the signal from a first logic-family-level signal to a second logic-family-level signal; and
   an output node coupled to the input stage; and
a second integrated circuit coupled to the output node.

22. The electronic system of claim 21, further comprising a third integrated circuit suited to operate according to a first logic level family coupled to the input node and wherein the second integrated circuit is suited to operate according to a second logic level family.

23. The electronic system of claim 21 wherein the first integrated circuit comprises a processor and the second integrated circuit comprises a memory.

24. A method, comprising:
receiving a signal having a frequency at an input stage via an input node;
if the frequency is below a predetermined threshold, then coupling the input stage to supply node via a first circuit path having a first resistance; and
if the frequency is above the predetermined threshold, then coupling the input stage to a supply node via a second circuit path having second resistance that is less than the first resistance.

25. The method of claim 24 wherein the coupling of the input stage to the first circuit path further comprises coupling the input stage to a quiescent-current-limiting circuit and wherein the coupling of the input stage to the second circuit path further comprises coupling the input stage to a feedback circuit operable to provide current to the input stage.

26. The method of claim 25, further comprising translating the signal from a first voltage to a second voltage.

27. The method of claim 24, further comprising providing a hysteresis current to the output signal within a first predetermined duration of time after receiving the input signal.

28. The method of claim 27, further comprising providing a second hysteresis current to the output signal within a second predetermined duration of time after the first predetermined duration of time.

* * * * *